United States Patent
Jain et al.

(10) Patent No.: US 9,444,440 B2
(45) Date of Patent: Sep. 13, 2016

(54) TRANSITION DETECTOR

(75) Inventors: Abhishek Jain, Delhi (IN); Kallol Chatterjee, Noida (IN); Chittoor Parthasarathy, Greater Noida (IN); Saurabhkumar Singh, Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 697 days.

(21) Appl. No.: 13/174,574

(22) Filed: Jun. 30, 2011

(65) Prior Publication Data
US 2013/0003905 A1    Jan. 3, 2013

(51) Int. Cl.
H04L 7/02       (2006.01)
H03K 5/1534     (2006.01)
H03K 19/003     (2006.01)

(52) U.S. Cl.
CPC ...... H03K 5/1534 (2013.01); H03K 19/00346 (2013.01)

(58) Field of Classification Search
CPC .............. H03K 19/00346; H03K 5/1534
USPC ....................................... 375/360
See application file for complete search history.

(56) References Cited

U.S. PATENT DOCUMENTS

| 7,116,142 B2* | 10/2006 | Ferraiolo et al. | 327/149 |
| 2003/0197547 A1* | 10/2003 | Mizuno et al. | 327/534 |
| 2009/0031155 A1* | 1/2009 | Hofmann et al. | 713/321 |
| 2009/0207672 A1* | 8/2009 | Nagai | 365/189.08 |
| 2010/0019834 A1* | 1/2010 | Zerbe et al. | 327/538 |

OTHER PUBLICATIONS

James Tschanz, Keith Bowman, Steve Walstra, Marty Agostinelli, Tanay Karnik, and Vivek De, "Tunable Replica Circuits and Adaptive Voltage-Frequency Techniques for Dynamic Voltage, Temperature, and Aging Variation Tolerance", 2009 Symposium on VLSI Circuits Digest of Technical Papers, pp. 112-113.

Mridul Agarwal, Bipul C. Paul, Ming Zhang, and Subhasish Mitra, "Circuit Failure Prediction and Its Application to Transistor Aging", 25th IEEE 2007 VLSI Test Symmposium, pp. 8.

David Bull, Shidhartha Das, Karthik Shivashankar, Ganesh S. Dasika, Krisztian Flautner, and David Blaauw, "A Power-Efficient 32 bit ARM Processor Using Timing-Error Detection and Correction for Transient-Error Tolerance and Adaptation to PVT Variation", IEEE Journal of Solid-State Circuits, vol. 46, No. 1, Jan. 2011, pp. 18-31.

Keith A. Bowman, James W. Tschanz, Nam Sung Kim, Janice C. Lee, Chris B. Wilkerson, Shih-Lien L. Lu, Tanay Karnik, and Vivek K. De, "Energy-Efficient and Metastability-Immune Timing-Error Detection and Recovery Circuits for Dynamic Variation Tolerance", 978-1-4244-1811-4/08/, 2008 IEEE, pp. 4.

* cited by examiner

*Primary Examiner* — Nader Bolourchi
(74) *Attorney, Agent, or Firm* — Gardere Wynne Sewell LLP

(57) ABSTRACT

An embodiment of a detector includes first and second generators. The first generator is operable to receive a transition of a first signal and to generate in response to the transition a first pulse having a length that is approximately equal to a length of a detection window. And the second generator is operable to receive a second signal and to generate a second pulse having a relationship to the first pulse in response to a transition of the second signal occurring approximately during the detection window.

32 Claims, 4 Drawing Sheets

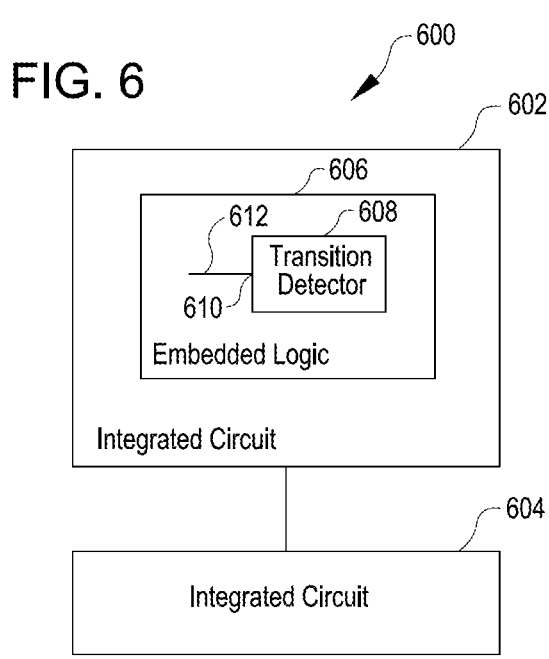

TRANSITION DETECTOR

TECHNICAL FIELD

One or more embodiments relate to transition detectors. Particularly, but not exclusively, one or more embodiments relate to a transition detector for detecting a data transition within a clock window.

BACKGROUND

Transition detector circuits may be used to monitor timing and critical paths of applications such as on-chip logic. Transition detectors may detect a transition in a data signal relative to a clock signal. For example a transition detector may detect whether a transition occurs within a window relative to the clock signal, and may be applicable to circuits where timing errors due to a data transition occurring too close to a clock edge may be identified and corrected.

Various implementations of transition detectors exist. For example, IEEE Journal January 2011, "A Power Efficient 32 Bit ARM Processor Using Timing-Error Detection and Correction for Transient-Error Tolerance and Adaptation to PVT Variation" Bull D., Das S., Shivashankar K., Dasika G., Flauntner K, Blaauw D., which is incorporated herein by reference, describes an example of a transition detector having two different pulse-generating parts for detecting a data-rise and a data-fall transition of a signal.

ICICDT 08 IEEE Conference "Energy-Efficient and Metastability-Immune Timing-Error Detection and Recovery Circuits for Dynamic Variation Tolerance", Bowman K., Tschanz J., Kim N., Lee J., Wilkerson C., Lu S., Karnik T., De V., which is incorporated herein by reference, describes a transition detector implemented using latches and having an error-retaining circuit.

$25^{th}$ IEEE VLSI Test Symposium "Circuit Failure Prediction and Its Application to Transition Ageing", Mitra S., Zhang M., Paul B., Agarwal M., which is incorporated herein by reference, describes a transition detector having two latches with a delayed input into the second latch and comparing the outputs of both latches for differences between the signals.

Due to the sensitive timing issues that are dealt with by transition detectors, some transition detectors may have contention issues within their design and/or operation. Some transition detectors incorporating a level-sensitive approach may miss transitions and may, therefore, not be suitable for circuits that are sensitive to error.

Furthermore, a physical implementation of a transition detector may lead to errors within the functioning of the transition detector due to physical factors such as operational parameters and global and local variations.

SUMMARY

According to an embodiment, a transition detector includes: clock-pulse-generation circuitry configured to generate a clock pulse in response to a clock signal; and data-pulse-generation circuitry configured to generate a data pulse in response to a transition of a data signal, the data-pulse-generation circuitry comprising delay circuitry configured to delay the generation of the data pulse such that the data pulse overlaps the clock pulse when a transition of the data signal occurs within a time window of the clock signal.

In an embodiment, the delay circuitry may be configured to delay the data signal by a first programmable delay, the data pulse being generated in response to the delayed data signal. The first programmable delay may be configured to correspond to a time difference between a start of the time window and a clock edge of the clock signal.

In an embodiment, the clock-generation circuitry may be configured to generate the clock pulse having a pulse width corresponding to a second programmable delay. The clock second programmable delay may correspond to a width of the clock window. The clock-generation circuitry may be configured to generate the clock pulse responsive to a clock edge of the clock signal.

In an embodiment, the transition detector may be configured to have a self-test mode in which the data-pulse-generation circuitry is configured to generate the data pulse in response to a transition of the clock signal. The transition detector may further comprise a multiplexer configured to select the self-test mode.

In an embodiment, the transition detector may be configured to assert a flag if the clock pulse and the data pulse overlap. The transition detector may be configured to assert the flag until the transition detector is reset.

According to an embodiment, a method includes: generating a clock pulse in response to a clock signal; and generating a data pulse in response to a transition of a data signal, said generating the data pulse comprising delaying the generation of the data pulse such that the data pulse overlaps the clock pulse when a transition of the data signal occurs within a time window of the clock signal.

An embodiment of a method may further include detecting a transition of a data signal within the time window if the clock pulse and the data pulse overlap.

An embodiment of a method may further include delaying the data signal by a first programmable delay and generating the data pulse in response to the delayed data signal. Delaying the data signal by a first programmable delay may include delaying the data signal by a time difference between a start of the time window and a clock edge of the clock signal.

An embodiment of a method may further include generating the clock pulse having a pulse width corresponding to a second programmable delay, which may correspond to a width of the clock window. Generating the clock pulse may comprise generating the clock pulse responsive to a clock edge of the clock signal.

An embodiment of a method may further include generating a data pulse in response to a transition of the clock-signal-transition detector in accordance with a self-test mode of operation. The method may further include selecting the self-test mode of operation. The method may further include asserting a flag if the clock pulse and the data pulse overlap.

According to an embodiment, a transition detector includes: clock-pulse-generation means for generating a clock pulse in response to a clock signal; and data-pulse-generation means for generating a data pulse in response to a transition of a data signal, the data-pulse-generation means comprising delay means for delaying the generation of the data pulse such that the data pulse overlaps the clock pulse when a transition of the data signal occurs within a time window of the clock signal.

According to an embodiment, an integrated circuit includes a transition detector, the transition detector including clock-pulse-generation circuitry configured to generate a clock pulse in response to a clock signal; and data-pulse-generation circuitry configured to generate a data pulse in response to a transition of a data signal, the data-pulse-generation circuitry comprising delay circuitry configured to delay the generation of the data pulse such that the data pulse overlaps the clock pulse when a transition of the data signal occurs within a time window of the clock signal.

According to an embodiment, an integrated circuit includes embedded logic and at least one critical path endpoint; and at least one transition detector associated with a critical path endpoint, the transition detector including clock-pulse-generation circuitry configured to generate a clock pulse in response to a clock signal; data-pulse-generation circuitry configured to generate a data pulse in response to a transition of a data signal, the data-pulse-generation circuitry comprising delay circuitry configured to delay the generation of the data pulse such that the data pulse overlaps the clock pulse when a transition of the data signal occurs within a time window of the clock signal.

BRIEF DESCRIPTION OF THE DRAWINGS

One or more embodiments are now described by way of example only with reference to the accompanying drawings in which:

FIG. 6 is a diagram of a system that includes an embedded transition detector, according to an embodiment.

DETAILED DESCRIPTION

One or more embodiments of a transition detector are described. A transition detector of an embodiment may address timing-contention issues associated with detection of a transition relative to a clock edge or other timing signal. A transition detector of an embodiment may monitor timing and critical paths.

An embodiment of a transition detector may include one or more self-test capabilities. An embodiment of a self-test mechanism may be used to test a transition detector once it has been implemented in silicon. In an embodiment, the self-test mechanism is used to detect manufacturing faults.

One or more embodiments may detect a transition within a timing window. In an embodiment, the window size may be tuneable. In this manner, an embodiment may be tuneable for use in different applications with different window-size requirements.

One or more applications or embodiments may be applicable to critical paths and systems where adaptive voltage scaling or such methods are used.

One or more embodiments may be applied to systems where a timing failure is detected. A timing failure may occur when a data signal transitions within a window with respect to a clock edge. For example a data signal may not be sampled correctly and/or metastability errors may occur. In another example, a data signal may be delayed and a data transition may arrive after a clock edge and incorrect data may be sampled.

In order to detect if a failure has occurred, one or more embodiments include a transition detector that detects whether a data transition occurs in a predetermined clock window. A clock window may be chosen such that data transitions occurring in this window are likely to result in a failure. By way of example, the failure may be due to incorrect data being sampled or metastability.

Figure 1:
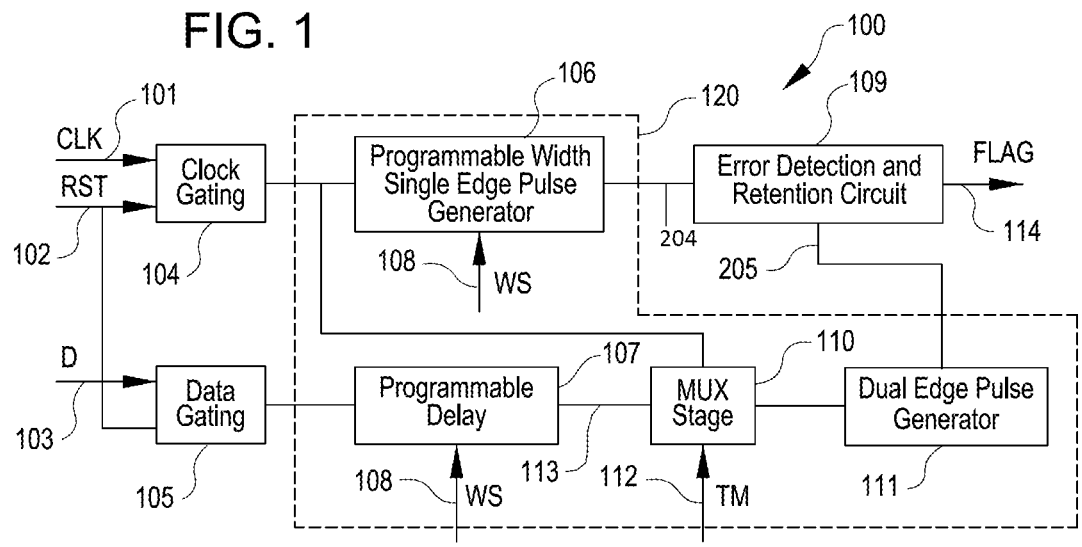
FIG. 1 is a block diagram of a transition detector according to an embodiment.

FIG. 1 is a schematic diagram of an embodiment of a transition detector 100.

The transition detector 100 of FIG. 1 may receive a clock signal 101, a reset signal 102, a data signal 103, and a window-select signal 108. For example, in an embodiment in which the transition detector 100 monitors a critical-path end point, the clock signal 101 may correspond to a signal controlling the timing of the critical path and the data signal 103 may correspond to data clocked through the critical path. It may be appreciated that this is by way of example and the transition detector 100 may be used to detect transitions on other signals.

The transition detector 100 may include a clock-gating circuit 104, a data-gating circuit 105, a window-generating circuit 120 and an error-detection-and-retention circuit 109. The clock-gating circuit may have the clock signal 101 and the reset signal 102 as inputs. The data-gating circuit 105 may have the data signal 103 and the reset signal 102 as inputs. The clock-gating circuit 104 and data-gating circuit 105 may each provide an output to the window-generating circuit 120.

The window-generating circuitry 120 may generate a clock pulse corresponding to a clock edge and a data pulse corresponding to a transition on the data signal. The clock and data pulse may be output to the error-detection-and-retention circuit 109, which may generate a flag indicating that an error has occurred.

The window-generating circuitry 120 may comprise a clock-pulse generator 106 and a data-pulse generator 111. In an embodiment where a window size is programmable, the clock-pulse generator 106 may receive a window-size signal WS 108 and the window-generating circuitry 120 may include a programmable delay 107, which may also receive the window-size signal 108. In an embodiment that incorporates self-test, a multiplexor 110 may also be included with a test-mode input signal TM 112.

Referring to FIG. 1, in an embodiment, the transition detector 100 incorporates a programmable window size and a self-test mode. The output from the clock-gating circuit 104 is input to the clock-pulse-generating circuit 106 and the output of the data-gating circuit 105 is input to the programmable delay 107. An output from the programmable delay 107 and output from the clock-gating circuit 104 is input to the multiplexor 110. An output from the multiplexor 110 is input to the data-pulse-generating circuit 111, which provides an output to the error-detection-and-retention circuit 109. The error-detection-and-retention circuit 109 also receives an input from the clock-pulse generator 106.

The multiplexor 110, programmable delay 107, test-mode-select signal 112, and window-size signal 108 may be optional. In an embodiment, the programmable delay 107 may be replaced by a fixed-delay circuit, which may be incorporated into the data-pulse generator 111.

An embodiment of the operation of an embodiment of the transition detector 100 may be illustrated with reference to FIG. 2, which is a timing diagram showing the clock signal 101, the data signal 103, a clock-pulse signal 204 output from the clock-pulse-generating circuit 106, a data-pulse signal 205 output from the data-pulse-generating circuit 111, and a flag signal.

In an embodiment, the transition detector 100 may operate to detect a data transition in a clock window. The clock window may be a period of time in relation to the clock signal 101. For example, the clock window may be a period of time prior to a rising clock edge. It is appreciated that this is by way of example only, and the clock window may be set as a period of time at any point before and/or after a rising edge of the clock signal.

The clock-pulse-generating circuit 106 receives a signal indicative of the clock signal 101 from the clock gating circuit 104, and receives a window-size signal 108. The window-size signal 108 may indicate a width of a window in which a transition of the data signal 103 is to be detected.

The clock-pulse-generating circuit 106 may generate a clock pulse 204 on a rising edge of the clock signal 101 with a width corresponding to the window-size signal 108. It is appreciated that having a programmable window size may be optional and that in an embodiment, the clock-pulse-generating circuit 106 may generate a clock pulse of fixed width.

The programmable delay 107 may delay a signal corresponding to the data signal 103 based on the window-size signal 108. In an embodiment, the delay corresponds to a difference between the start of the window and a rising edge of clock signal 101. In another embodiment, the delay may correspond to window size. The delay may be such that a data transition within the window 201 is delayed to overlap the clock pulse. A data transition occurring before or after the window 201 may be delayed to occur before and after the clock pulse, respectively.

The delayed signal 113 corresponding to the data signal 103 is output to the multiplexor 110.

Figure 2:
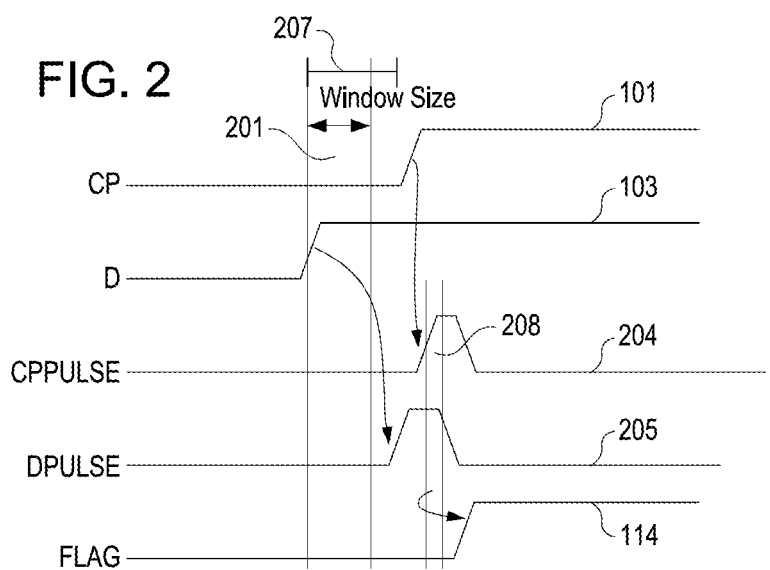
FIG. 2 is a timing diagram of signals generated by an embodiment of the transition detector of FIG. 1 in accordance with an embodiment.

In an embodiment of FIG. 2, a test mode is not selected and the multiplexor 110 outputs the delayed signal 113 to the data-pulse-generating circuit 111, which may generate a data pulse corresponding to an edge of the signal 113. In an embodiment, the data-pulse-generating circuit 111 is a dual-edge pulse-generating circuit in that it generates a data pulse for both a rising edge and a falling edge of the signal 113. In another embodiment, it may be desired to generate a pulse corresponding to one, but not both, of the rising and falling edges of the signal 113.

In an embodiment, when the transition detector 100 is in a self-test mode, the multiplexor 110 outputs a signal corresponding to the clock signal 101 from the clock-gating circuit 104 to the data-pulse-generating circuit 111. In such an embodiment, a transition of the signal input to the data-pulse-generating circuit 111 may correspond to a transition of the clock signal 101, and the data-pulse-generating circuit 111 may generate a pulse corresponding to the pulse generated by the clock-pulse-generating circuit. In a test mode, the clock pulse and a data pulse may be generated corresponding to a rising edge of the clock signal 101.

The clock-pulse signal 204 and data-pulse signal 205 may be input into the error-detection-and-retention circuit 109, which may detect whether there is an overlap between a clock pulse and a data pulse. In an embodiment, if the data signal transitioned during the window 201 then the clock pulse and the data pulse may overlap. Such an overlap is shown as 208 in FIG. 2. In response to the overlap, the error-detection-and-retention circuit 109 may generate the flag signal.

In an embodiment, an overlap between the clock pulse and data pulse may occur when the transition detector 100 is in a self-test mode. In this case, the error-detection-and-retention circuit 109 may generate the flag signal.

The flag signal may indicate that a failure has been detected and may be passed to external circuitry such as error-correction or monitoring circuitry. In an embodiment, the error-history circuit (not shown in FIGS. 1 and 2) may hold the flag at a value until a next data transition is received and detected. Alternatively, the flag may be held until the flag is reset. The flag may also be provided as feedback to the error-detection-and-retention circuit 109.

The error-detection-and-retention circuit 109 may be operable to assert the flag when an overlap is detected and keep the flag asserted until the transition detector 100 is reset. The transition detector 100 may be reset by asserting the reset signal 102. In an embodiment, the reset signal 102 may also be input into the error-detection-and-retention circuit 109.

It may be appreciated that the generation of a flag is by way of example only, and an embodiment may include other indications of error. For example, in an embodiment, a signal may be output indicating a state of the transition detector 100.

In an embodiment, the clock- and data-gating circuits 104 and 105 may output a signal corresponding to the clock signal 101 and data signal 102 only when the reset signal 102 is unasserted.

Figure 3:
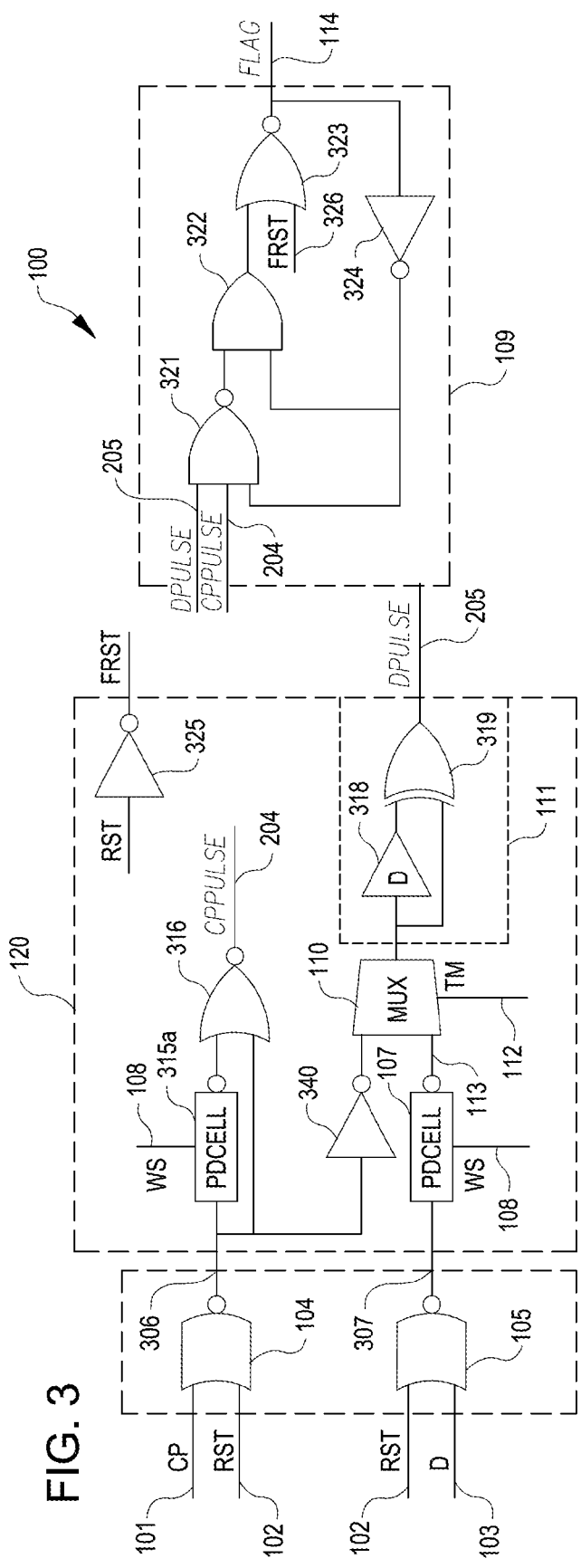
FIG. 3 is a schematic diagram of an embodiment of a transition detector.

FIG. 3 is a schematic diagram of an embodiment of the transition detector 100 of FIG. 2.

An embodiment of the transition detector 100 of FIG. 3 includes clock-gating circuit 104 and data-gating circuit 105, window-generation circuitry 120, and error-detection-and-retention circuit 109.

The transition detector 100 may receive a clock signal 101 and a data signal 102. The transition detector 100 may also receive a reset signal 103. It may be appreciated that the reset signal 103 may be optional in an embodiment. For example, the transition detector 100 may be alternatively reset by a hard reset, or by a combination of other signals.

In an embodiment, when the reset signal 103 is not asserted, the clock- and data-gating circuits 104 and 105 pass the clock signal 101 and the data signal 102 to the window-generation circuit 120. When the reset signal 103 is asserted, the clock and data signals 101 and 102 may not be input into the window-generation circuit 120.

The window-generation circuit 120 may receive a window-size signal 108, which may indicate a size and/or position of a window in which a transition in the data signal is to be detected.

The window-generation circuit 120 may also receive a test-mode signal 112, which may indicate whether the window-generation circuit 120 is to operate in a transition-detection mode or a self-test mode. In other words, the window-generation circuit 120 may operate to detect a transition of the data signal 102 within a window or run a self-test in order to determine whether the window-generation circuit 120 is operating correctly.

The window-generation circuitry 110 may generate and output the clock-pulse and the data-pulse signals 204 and 205.

The clock-pulse signal 204 and the data-pulse signal 205 may be input into the error-detection-and-retention circuit 109.

In an embodiment of FIG. 3, the clock-gating circuit 104 and the data-gating circuit 105 include first and second NAND gates 104 and 105. The clock signal 101 and the reset signal 102 may be put into the first NAND gate 104. The data signal 103 and the reset signal 102 may be input into the second NAND gate 105. The first NAND gate 104 may output a signal 306 to the window-generation circuitry 120. The second NAND gate 105 may output a signal 307 to the window-generation circuitry 120.

The signal 306 may correspond to the clock signal 101 when the reset signal 102 is not asserted. Similarly, the signal 307 may correspond to the data signal 103 when the reset signal 102 is not asserted. An assertion of the reset signal 102 may disable the outputs of the first and second NAND gates 104 and 105. In an embodiment, the reset signal may be asserted to reset the transition detector 100. In another embodiment, the reset signal 103 may be asserted for a period corresponding to a period of low-power operation in which the transition-detection circuit 100 is disabled.

It may be appreciated that reset signal 102 and NAND gates 104 and 105 may be optional in an embodiment. For example, the clock signal 101 and data signal 103 may be directly input to the window-generation circuitry 120.

The first input 306 may be input into a first inverting programmable delay cell 315a, which may provide an output to a NOR gate 316. The first inverting programmable delay cell 315a may also receive the window-size signal 108. A second input may be received at the NOR gate 316 from the signal 306. The NOR gate 316 may output the clock pulse 204.

The second signal 307 may be input into a second inverting programmable delay cell 107, which may also receive the window-size signal 108. The output of the second inverting programmable delay cell 107 may form an input into a multiplexer 110. The multiplexer 110 may receive, as its selection input, the test-mode signal 112. The multiplexer 110 may receive, as a second input, a signal from an inverter 340, which may invert the signal 306.

The output of the multiplexer circuit 110 may be used to generate a data pulse. The output may be input into a delay 318, which may provide an input into an XOR gate 319. A second input of the XOR gate 319 may be received from the output of the multiplexer 110. The XOR gate 319 may receive the output of the multiplexor 110 as a first input and a delayed output from the multiplexor 110 as a second input. The output of the XOR gate 319 may be the data-pulse signal 205.

Referring to FIG. 3, in an embodiment, the test-mode signal 112 may indicate that the window-generation circuitry 120 is operating in accordance with a detection of a data transition within a clock window. In an embodiment, the window-size signal 108 may indicate to the first and second inverting programmable delay cells 315a and 107 a window size in which a data transition is to be detected. The multiplexer 110 may couple the output of the second inverting programmable delay cell 107 to the output of the multiplexer 110 in response to the test-mode select signal 111.

When the circuit 100 is in a data-transition-detection mode, the reset signal 102 may not be asserted and signal 306 may correspond to an inverted clock signal 101. The inverted clock signal 306 may be input into the first inverting programmable delay cell 315a. The first inverting programmable delay cell 315a may both delay and invert the signal 306 and provide an output to the NOR gate 316. In other words, a signal corresponding to a delayed clock signal 101 may be provided to the NOR gate 316 from the inverting and programmable delay circuit 315a. A second input of the NOR gate 316 may receive the inverted clock signal 306.

The NOR gate 316 may output a clock pulse signal 204 when the inverted clock signal 306 and delayed clock signal are both low. In an embodiment, a start of the clock pulse on the clock pulse signal 204 is triggered by a falling edge of the inverted clock signal 306. This corresponds to a clock pulse being triggered by a rising edge of the clock signal 101. The width of the clock pulse may be dependent on the delay between the inverted clock signal 306 and delayed clock signal from the cell 315a.

When no delay is introduced, the signal from the first inverting programmable delay cell 315a may correspond to the clock signal and this signal and the inverted clock signal 106 will not overlap in value. When a delay is introduced, the signal from the first inverting programmable delay cell 315a and the inverted clock signal 306 may both be low for a period corresponding to the delay. In an embodiment, the delay corresponds to a width of a window. This may be set by the window-size signal 108. A clock pulse may be generated at a rising edge of a clock signal and having a width of a window size specified by the window size signal.

In an embodiment, of the transition detection mode, the reset signal may not be asserted and the data signal 103 is inverted and passed to the output of the second NAND gate 105. Signal 307 may correspond to an inverted data signal 103.

The signal 307 may be input into the second inverting programmable delay cell 107, which may delay and invert the signal 307. The output of the second inverting programmable delay cell 107 may be input to the multiplexer 110. In an embodiment, the programmable delay of the second inverting programmable delay cell 107 may correspond to a difference in time between the start of the clock window and a rising edge of the clock. For example, a data transition occurring at the start of the window will be delayed by the second inverting programmable delay cell 107 and provided to the multiplexer at the next rising edge of the clock.

The delay 318 and XOR gate 319 may generate as a data pulse the data-pulse signal 205. The XOR gate 319 may generate a data pulse when the output of the multiplexor 110 and delayed output of the multiplexor differ. In other words, a data pulse may be generated having a width corresponding to the delay 318. In an embodiment, the delay 318 may be fixed or programmable to correspond to a width of the window. In another embodiment, the delay 318 may be chosen as a minimum amount of time to detect that both the clock pulse and the data pulse are high. In an embodiment, the length of the delay may be determined by the device characteristics of the error-detection circuit 109.

In an embodiment, a clock window may be set as a period preceding a rising clock edge. In such an embodiment, the delay introduced by the second inverting programmable delay cell 107 may correspond to the window width. In another embodiment, the delay introduced by the second inverting programmable delay cell 107 may correspond to the time between a start of a clock window and a rising edge of a clock signal.

Referring to FIG. 3, in an embodiment, the transition detector 100 may operate in a self-test mode. A clock pulse may be generated similarly to the clock-pulse generation in transition-detection mode. The data pulse may be generated in response to a clock signal instead of a data signal in self-test mode. By using the clock signal 101 in place of the data signal 102, a data transition occurring within a window for each clock edge may be tested.

When the window-generation circuit 120 is to operate in a self-test mode, the test mode signal 112 may be asserted and the multiplexer 110 may couple the input from the delay block 340 to the output of the multiplexer 110.

In this case, the inverted clock signal 306 and inverted clock signal 306 delayed by the delay 318 may be used to generate a data pulse. A data pulse may therefore be generated at each rising edge of the clock signal 101. In this manner, in a self-test mode, the data pulse and the clock pulse may overlap for each rising edge of the clock signal.

In this manner an occurrence of an error is known and an output of the transition detector 110 may be checked for variation to this. For example, if the flag does not indicate an error on each clock cycle, this may indicate that the circuitry is not operating correctly.

In order to detect whether an error has occurred, the error-detection-and-retention circuit 109 may receive the data-pulse signal 204 and clock-pulse signal 205 from the window-generation circuit 120. The flag signal may be fed back into the error-detection-and-retention circuit 109.

Referring to FIG. 3, in an embodiment, the error-detection-and-retention circuit 109 comprises a NAND gate 321, AND gate 322, NOR gate 323 and inverter 324.

The clock-pulse signal 204 and data-pulse signal 205 may be input to the NAND gate 321. An output of the NAND gate 321 is input to the AND gate 322 and an output of the AND gate 322 is input to the NOR gate 323. An output of the NOR gate 323 provides the flag signal 114. The flag signal 114 may be fed back into the error-detection-and-retention circuit 109 by providing an input to the inverter 324. The output of the inverter 324 is input into the NAND gate 321 and the AND gate 322. The error-detection-and-retention circuit 109 may also receive a flag reset signal 326 generated from the reset signal 102 inverted by an inverter 325. The flag reset signal 326 may be input to the NOR gate 323.

When the flag is not asserted, an inverted flag signal is provided to the NAND gate 321 and AND gate 322 and opens them, allowing the inputs from the signals 204 and 205 and the input from NAND gate 321 to be output respectively. When a flag is asserted, the inverted flag signal closes the NAND and AND gates, and NOR gate 323 holds the flag asserted. When the flag reset signal is asserted, it forces the output of the NOR gate 323 to de-assert the flag and the AND and NAND gates are opened.

For example, in an embodiment, when the flag 114 is not asserted, the inverter 324 provides a high signal to the NAND gate 321 and the AND gate 322. The NAND gate 321 is open, allowing the output of the NAND gate to go low when the signals 204 and 205 go high. This may correspond to a clock pulse and a data pulse overlapping. The high inverted flag signal input to the AND gate may open the AND gate allowing the output of the AND gate to go low when it receives a low input from the NAND gate 321.

The NOR gate 323 receives the FRST signal. When the flag reset signal 326 is not asserted, it allows the output from the AND gate to be inverted by the NOR gate 323 and output as the flag signal 114. In the case where the data and clock pulse overlap, the output of the NOR gate 323 asserts the flag signal and the inverted flag signal closes the NAND gate 321 and AND gate 322, holding their outputs high and low respectively. The NOR gate 323 receives the low from the AND gate 322 and de-asserted flag reset signal 326 and holds the flag asserted.

When the flag reset signal 326 is asserted it may force the output of the NOR gate 323 low such that the flag is de-asserted and the inverted flag re-opens the AND and NAND gates.

In an embodiment, the flag 114 is asserted when an overlap in a data and clock pulse is detected and is held asserted until the flag 114 is reset. In this manner, the transition-detection circuit 100 may detect an error and output a flag indicating the error until the transition-detection circuit has been reset. In this manner, in an embodiment, the transition-detection circuit 100 may hold an error until the error has been acknowledged.

It may be appreciated that this is by way of example only and in an embodiment the error-detection circuit may output only a signal indicating that an overlap in the data and clock pulse has occurred.

Figure 4:
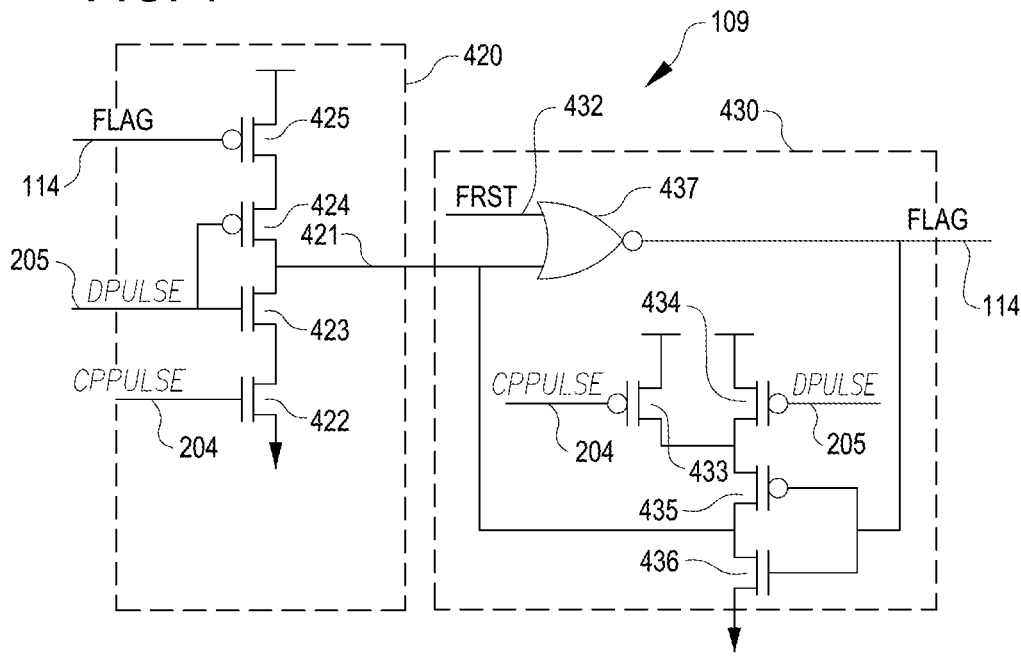
FIG. 4 is a schematic diagram of an embodiment of an error-detection-and-retention circuit.

FIG. 4 is a schematic diagram of an embodiment of the error-detection-and-retention circuit 109, which may comprise an error-detection circuit 420 and an error-history circuit 430.

The error-detection circuit 420 may include first and second PMOS transistors 424 and 425 and first and second NMOS transistors 422 and 423. The first NMOS transistor 422 may have a source node coupled to ground and may receive the clock pulse signal 204 at a gate node. A drain node of the first NMOS transistor 422 may be coupled to a source node of the second NMOS transistor 423. The second NMOS transistor 423 may receive the data-pulse signal 205 at its gate node and may have a drain node coupled to a drain node of a first PMOS transistor 424. The first PMOS transistor 424 may have a gate node coupled to the data-pulse signal 205 and a source node coupled to a drain of a second PMOS transistor 425. A gate of the second PMOS transistor 425 may be coupled to a flag input 114 and a source node of the second PMOS transistor 425 may be coupled to a voltage power supply.

The drain node of the second NMOS transistor 423 and the first PMOS transistor 424 may be coupled to form an output 421 to the error-history circuit 430.

The output 421 may be input into a NOR gate 437, the output of which generates the flag 114. In an embodiment, a high flag may indicate that an error has occurred and a low flag may indicate that no error was detected. The NOR gate 437 may also receive a flag reset signal 432 generated from the reset signal by an inverter (not shown in FIG. 4). The flag reset signal may reset the NOR gate 437 to de-assert the flag.

The second NMOS transistor 423 and first PMOS transistor 424 may act as an inverter for data-pulse signal 205. If the data-pulse signal 205 is high and the clock-pulse signal 204 is high, the first and second NMOS transistors 422 and 423 are on and pull the signal 421 to ground. Under normal operation the flag reset signal is not asserted and the output of NOR gate 437 is a high when the signal 421 is low. In this case, the flag 114 is asserted to indicate that an error has occurred.

The flag 114 is input to the second PMOS transistor 425. The second PMOS transistor may be off when the flag is asserted and prevents the output 421 from being pulled high when the data-pulse signal 205 is low and the first PMOS transistor 424 is on. In this case, the flag may be asserted until it is reset by the flag reset 326.

If flag reset 432 is asserted such that the flag is reset, then the second PMOS transistor 425 may turn on and may pull the output 421 to high when the data-pulse signal 205 is low and the first PMOS transistor 423 is on.

The error-history circuit 430 may monitor the flag and may keep it asserted until the flag is reset. The error-history circuit may provide a feedback to the error-indication signal 421 from the error-detection circuit and may keep this signal at a value indicating an error until the flag 114 is reset.

The error-history circuit 430 may comprise the flag reset signal 432, the NOR gate 437 and flag signal 114. It may be appreciated that the flag-reset signal 432 and NOR gate 437 and flag 114 may alternatively be incorporated in other circuitry.

The error-history circuit 430 may also receive the clock-pulse signal 204 and the data-pulse signal 205 at a gate node of a first and second PMOS transistor 433 and 434. A source node of the first and second PMOS transistors 433 and 434 may be coupled to a voltage source. A drain node of the first and second PMOS transistors 433 and 434 may be coupled together to a source of a third PMOS transistor 435. A drain node of the third PMOS transistor 435 may be coupled to a drain of a first NMOS transistor 436. The first NMOS transistor 436 may have a grounded source node. A gate node of the third PMOS transistor 435 and first NMOS transistor 436 may be coupled together to the flag 114. A drain node of the third PMOS transistor 435 and third NMOS transistor 436 may be further coupled to the signal 421.

When the clock-pulse signal 204 and the data-pulse 205 are high, the first and second PMOS transistors 433 and 434 may be off. The signal 421 from the error-detection circuit 420 may be pulled low which in turn may raise the flag 114. A raised flag 114 may turn NMOS transistor 436 on and PMOS transistor 435 off. The on transistor 436 may pull the output 421 low. The high flag 114 may be provided at the gate of the second PMOS transistor 425 and turn it off.

When clock and data pulses have passed, the data pulse and the clock pulse inputs will go low. Transistors 422, 423, and 425 will be off and the error-detection circuit may not pull node 421 high or low. The high flag may turn transistor 435 off and transistor 436 on pulling the node 421 low. This may keep the flag asserted regardless of the clock and data pulse inputs.

When the flag is reset, the gates of transistor 435 and 436 will go low. This will turn transistor 436 off and transistor 435 on. While the clock and data pulses are still low, transistors 433, 434 and 435 will all be on pulling the node 421 to high. This will pass to the NOR gate 437 and reset the flag 114 to low.

It may be appreciated that the circuitry of FIG. 4 is by way of example only, and additional or different circuitry may be implemented. For example, other types of transistors may be used and/or the channel type of the transistors may be varied.

Figure 5:
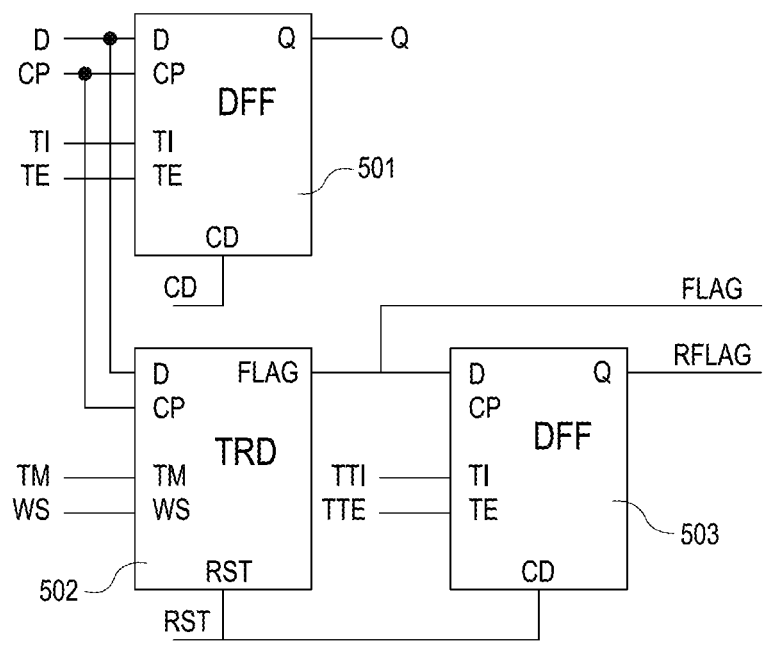
FIG. 5 is a schematic diagram of a transition detector implemented with a critical-path data latch in accordance with an embodiment.

In an embodiment, the programmable delay cells 107 and 315a (FIG. 3) may generate a delay based on a window-size-select signal 108. In this manner, an embodiment may provide a tuneable window size. An embodiment may, therefore, be applicable to a variety of different applications. FIG. 5 shows one example of such an application in a critical-path-end-point monitoring.

Referring to FIG. 5, in an embodiment, a first D flip-flop 501 is provided. This may correspond to a critical-path end point. The flip-flop 501 receives a data input signal D and a clock input signal CD and outputs a data signal Q. The first flip-flop 501 may also include an input for reset signal CD and a scan input and scan-enable signal TI and TE. In parallel with the first flip-flop, a transition detector 502 may be provided. The transition detector 502 may be an embodiment of the transition detector 100 of FIG. 1.

The transition detector 502 may receive the data D and the clock CP inputs and a reset signal RST. In addition, the transition detector 502 may receive a test-mode signal TM and a window-size signal WS. In an embodiment, this may correspond to the test-mode signal 112 and window-size signal 108 of FIGS. 1 and 3. A flag is output to a data input D of a third flip flop 503. The flag may correspond to the flag 114 in an embodiment.

The third flip flop 503 may receive a transition-detector-502 flip-flop scan input TTI in its scan input TI and a transition-detector-scan-enable signal TTE in its scan-enable input TE. An output signal RFLAG may be provided from the second D flip-flop 503. In a critical endpoint monitoring system, the RFLAG signal may be coupled to a scan input TTI of a next monitoring system. In this manner, it may be used for scan-chain stitching for observing flags of all monitoring systems used in the design.

It may be appreciated that such a system is way of example of an implementation of the transition detector 100 only and the transition detector 100 may have other applications and implementations.

FIG. 6 is a diagram of a system 600, according to an embodiment. The system 600 includes a first integrated circuit 602 coupled to a second integrated circuit 604, where the first and second integrated circuits may be disposed on a same integrated-circuit die or on respective dies, and at least one of the first and second integrated circuits may be a controller such as a processor. The first integrated circuit 602 includes embedded logic 606, which includes a transition detector 608 associated with (in an embodiment, located at) an endpoint 610 of a critical path 612.

An embodiment may provide a self-test mechanism. This may allow an embodiment to provide, for example, an indication of whether the transition detector 100 has been implemented correctly in silicon.

An embodiment may detect an error based on an overlap between a clock pulse and a data pulse. In an embodiment, the use of clock and data pulses may reduce possible timing contention. Additionally, in an embodiment, an output flag is held asserted until it is reset. This may, for example, reduce timing contention.

In the above description, one or more embodiments have been referred to with both self-test and programmable window-size capabilities. It may be appreciated that this is by way of example only and one of the self-test or programmable window may be implemented or both.

It may be appreciated that although in the foregoing description transistors have been exemplified as p-channel and n-channel MOSFETs, any other suitable types of transistors may be used. Additionally, it may be appreciated that in an embodiment the n-channel transistors may be replaced by p-channel transistors and the p-channel transistors with n-channel transistors and biased accordingly.

It may also be appreciated that asserting a signal may be pulling a signal high in an embodiment and pulling a signal low in another embodiment. It may also be appreciated the exemplified logic gates in the foregoing description are by way of example only and different or additional logic gates may be implemented. It may also be appreciated that an embodiment may be clocked on a rising edge of the clock signal or on a falling edge of the clock signal.

An embodiment may implement transition detectors in embedded systems. For example, in an embodiment, the transition detector may be implemented as part of a logic circuit on an integrated circuit. Alternatively, an embodiment may be implemented as a separate integrated circuit. And one or more of such integrated circuits may be coupled with one or more other integrated circuits and other components to form a system where at least one of the integrated circuits or other integrated circuits is a controller such as a processor.

From the foregoing it may be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A transition detector, comprising:
clock-pulse-generation circuitry configured to receive a clock signal and generate a clock pulse comprising a first pair of consecutive opposite logic transitions in response to a single transition edge of the clock signal, said first pair of consecutive opposite logic transitions separated by a length that is approximately equal to a length of a time window that is offset from the single transition edge of the clock signal; and
data-pulse-generation circuitry configured to receive a data signal and generate a data pulse comprising a second pair of consecutive opposite logic transitions in response to a single transition edge of the data signal, the data-pulse-generation circuitry including delay circuitry configured to delay the generation of the data pulse; and
a logic circuit coupled to logically combine the data pulse and the clock pulse in order to detect whether the data pulse and clock pulse simultaneously have a same logic state and generate an output signal in response thereto indicating that the single transition edge of the data signal has occurred within said time window.

2. The transition detector of claim 1 wherein the delay circuitry is configured to delay the data signal by a programmable delay, and wherein the data-pulse-generation circuitry generates the data pulse in response to the delayed data signal.

3. The transition detector of claim 2 wherein the programmable delay is configured to correspond to a time difference between a start of the time window and the single transition edge of the clock signal.

4. The transition detector of claim 1, wherein the clock-pulse-generation circuitry is configured to generate the clock pulse having a pulse width between transitions of the first pair of consecutive opposite logic transitions corresponding to a programmable delay.

5. The transition detector of claim 4 wherein the programmable delay corresponds to a width of the time window.

6. The transition detector of claim 1 wherein the transition detector is configured to have a self-test mode in which the data-pulse-generation circuitry is configured to generate the data pulse in response to said single transition edge of the clock signal.

7. The transition detector of claim 6 further comprising a multiplexer having a first input configured to receive the clock signal and a second input configured to receive the data signal, said multiplexer configured to select the clock signal for application to the data-pulse-generation circuitry in response to the self-test mode.

8. The transition detector of claim 1 wherein the logic circuit is configured to assert said output signal as a flag.

9. The transition detector of claim 8 wherein the logic circuit is further configured to continue to assert the flag until the transition detector is reset.

10. A circuit-implemented method, comprising:
receiving a clock signal;
generating a clock pulse comprising a first pair of consecutive opposite logic transitions in response to a single transition edge of the clock signal, said first pair of consecutive opposite logic transitions separated by a length that is approximately equal to a length of a time window that is offset from the single transition edge of the clock signal;
receiving a data signal;
generating a data pulse comprising a second pair of consecutive opposite logic transitions in response to a single transition edge of the data signal, wherein said generating the data pulse comprises delaying the generation of the data pulse;
logically combining the data pulse and the clock pulse in order to detect whether the data pulse and clock pulse simultaneously have a same logic state; and
generating an output signal in response to the logical combining indicating that the single transition edge of the data signal has occurred within said time window.

11. The method of claim 10 wherein said output signal indicates detecting a transition of the data signal within the time window if the clock pulse and the data pulse overlap.

12. The method of claim 10 further comprising delaying the data signal by a programmable delay and generating the data pulse in response to the delayed data signal.

13. The method of claim 12 wherein delaying the data signal by the programmable delay comprises delaying the data signal by a time difference between a start of the time window and a clock edge of the clock signal.

14. The method of claim 10, wherein the clock pulse has a pulse width corresponding to a programmable delay.

15. The method of claim 14 wherein the programmable delay corresponds to a width of the time window.

16. The method of claim 10, further comprising generating the data pulse in response to said single transition edge of the clock signal in accordance with a self-test mode of operation.

17. The method of claim 16, further comprising selecting the self-test mode of operation.

18. The method of claim 10, wherein generating the output signal comprises asserting a flag.

19. A detector, comprising:
a first generator configured to receive a first signal and to generate in response to a single transition of the first signal a first pulse comprising a first pair of consecutive opposite logic transitions separated by a length that is approximately equal to a length of a detection window;
a second generator configured to receive a second signal and to generate in response to a single transition of the second signal a second pulse comprising a second pair of consecutive opposite logic transitions; and
an error indicator
coupled to receive the first and second pulses from the first and second generators, respectively,
configured to detect whether the second pulse and the first pulse simultaneously have a same logic state, and
configured to indicate in response to said detection that the single transition of the first signal occurred during said detection window.

20. The detector of claim 19 wherein the first generator includes a delay circuit configured to delay the first signal by approximately the length of the detection window.

21. The detector of claim 19 wherein the first generator includes:
a delay circuit configured to delay the first signal by approximately the length of the detection window; and
a logic gate having a first input node coupled to receive the delayed first signal from the delay circuit and having a second input node coupled to receive the first signal.

22. The detector of claim 19 wherein the first generator includes:
- a delay circuit configured to delay the first signal by approximately the length of the detection window; and
- a NOR gate having a first input node coupled to receive the delayed first signal from the delay circuit and having a second input node coupled to receive the first signal.

23. The detector of claim 19 wherein the second generator includes a delay circuit configured to delay the second signal by approximately a time from a beginning of the detection window to the single transition of the first signal.

24. The detector of claim 19 wherein the second generator includes a shift circuit configured to shift the second signal such that a portion of the second signal that is aligned with a beginning of the detection window approximately corresponds to a portion of the shifted second signal that is aligned with the single transition of the first signal.

25. The detector of claim 19 wherein the second generator includes:
- a first delay circuit configured to delay the second signal by approximately a time from a beginning of the detection window to the single transition of the first signal;
- a second delay circuit configured to further delay the delayed second signal from the first delay circuit; and
- a logic gate having a first input node coupled to receive the delayed second signal from the first delay circuit and having a second input node coupled to receive the further delayed second signal from the second delay circuit.

26. The detector of claim 19 wherein the second generator includes:
- a first delay circuit configured to delay the second signal by approximately a time from a beginning of the detection window to the single transition of the first signal;
- a second delay circuit configured to further delay the delayed second signal from the first delay circuit; and
- an XOR gate having a first input node coupled to receive the delayed second signal from the first delay circuit and having a second input node coupled to receive the further delayed second signal from the second delay circuit.

27. The detector of claim 19, further including a mode selector configured to configure the second generator to receive the first signal and to generate the second pulse in response to the single transition of the first signal occurring approximately during the detection window.

28. The detector of claim 19, further including a mode selector configured to configure the second generator to receive the first signal and to generate the second pulse in response to the single transition of the first signal.

29. The detector of claim 19, wherein the error indicator includes:
- a first logic gate coupled to receive the first and second pulses and a feedback signal, and configured to generate a first intermediate signal;
- a second logic gate coupled to receive the first intermediate signal and the feedback signal and configured to generate a second intermediate signal; and
- a third logic gate coupled to receive the second intermediate signal and configured to generate an overlap-indication signal.

30. The detector of claim 29 wherein the feedback signal includes the overlap-indication signal.

31. The detector of claim 29, further including a fourth logic gate coupled to receive the overlap-indication signal and configured to generate the feedback signal.

32. The detector of claim 19, wherein the error indicator includes:
- a NAND gate coupled to receive the first and second pulses and a feedback signal, and configured to generate a first intermediate signal;
- an AND gate coupled to receive the first intermediate signal and the feedback signal and configured to generate a second intermediate signal; and
- a NOR gate coupled to receive the second intermediate signal and configured to generate an overlap-indication signal.

* * * * *

UNITED STATES PATENT AND TRADEMARK OFFICE
CERTIFICATE OF CORRECTION

PATENT NO. : 9,444,440 B2
APPLICATION NO. : 13/174574
DATED : September 13, 2016
INVENTOR(S) : Abhishek Jain et al.

It is certified that error appears in the above-identified patent and that said Letters Patent is hereby corrected as shown below:

On the Title Page

Item (75), Inventors, please correct the last inventor's name as follows:

Saurabh Kumar Singh, Noida (IN)

Signed and Sealed this
Second Day of January, 2018

Joseph Matal
*Performing the Functions and Duties of the*
*Under Secretary of Commerce for Intellectual Property and*
*Director of the United States Patent and Trademark Office*